United States Patent
Zeng et al.

(10) Patent No.: US 9,030,270 B2
(45) Date of Patent: May 12, 2015

(54) CASCADED DIPLEXER CIRCUIT

(75) Inventors: Yonghuang Zeng, San Diego, CA (US); Branislav Petrovic, La Jolla, CA (US)

(73) Assignee: Entropic Communications, Inc., San Diego, CA (US)

( * ) Notice: Subject to any disclaimer, the term of this patent is extended or adjusted under 35 U.S.C. 154(b) by 330 days.

(21) Appl. No.: 13/566,557

(22) Filed: Aug. 3, 2012

(65) Prior Publication Data

US 2014/0035700 A1     Feb. 6, 2014

(51) Int. Cl.
| | |
|---|---|
| *H03H 7/46* | (2006.01) |
| *H01P 5/12* | (2006.01) |
| *H03H 7/01* | (2006.01) |
| *H04N 7/10* | (2006.01) |
| *H04L 12/28* | (2006.01) |

(52) U.S. Cl.
CPC ............ *H03H 7/01* (2013.01); *H03H 7/461* (2013.01); *H03H 7/465* (2013.01); *H04N 7/102* (2013.01); *H04N 7/104* (2013.01); *H04L 12/2838* (2013.01)

(58) Field of Classification Search
CPC ..... H03H 7/463; H03H 7/465; H04B 1/0057; H04B 1/006; H04B 1/0096
USPC .......................................... 333/126–129, 132
See application file for complete search history.

(56) References Cited

U.S. PATENT DOCUMENTS

| | | | |
|---|---|---|---|
| 7,349,717 B2 * | 3/2008 | Block et al. ................. | 455/552.1 |
| 7,937,063 B1 | 5/2011 | Rausch et al. | |
| 2006/0194550 A1 | 8/2006 | Block et al. | |
| 2009/0160430 A1 | 6/2009 | Brown et al. | |
| 2010/0091752 A1 | 4/2010 | Kemmochi et al. | |
| 2014/0036744 A1 * | 2/2014 | Zeng et al. ..................... | 370/297 |

OTHER PUBLICATIONS

Int'l Application PCT/US13/51610, International Search Report and Written Opinion of the International Searching Authority, mailed Dec. 9, 2013.

\* cited by examiner

*Primary Examiner* — Robert Pascal
*Assistant Examiner* — Kimberly Glenn
(74) *Attorney, Agent, or Firm* — Richard Bachand

(57) ABSTRACT

A cascaded diplexer to create a cascaded diplexer leg with selectable passbands has a cascaded diplexer circuit. The diplexer circuit has a plurality of first bandpass filters, each having a passband. The diplexer circuit has a second bandpass filter having a passband and two terminals, coupled in series with a first bandpass filter. First and second switches are coupled in series with the second bandpass filter and the first bandpass filter, the first and second switches being configured to selectably switch the second bandpass filter into the circuit. The passband of the second bandpass filter is chosen to limit the passband of the first bandpass filters, such that when the second bandpass filter is switched into the circuit, the passband of the diplexer leg is reduced. The passband of the second bandpass filter may be a subset of, or overlaps with, the passband of the first bandpass filter.

12 Claims, 8 Drawing Sheets

CASCADED DIPLEXER CIRCUIT

TECHNICAL FIELD

The present invention relates generally to communication systems, and more particularly, some embodiments relate to cascaded diplexers for network communications.

DESCRIPTION OF THE RELATED ART

A local network may include several types of devices configured to deliver subscriber services throughout a home, office or other like environment. These subscriber services include delivering multimedia content, such as streaming audio and video, to devices located throughout the location. As the number of available subscriber services has increased and they become more popular, the number of devices being connected the home network has also increased. The increase in the number of services and devices increases the complexity of coordinating communication between the network nodes. This increase also generally tends to increase the amount and types of traffic carried on the network.

The network of FIG. 1 is one example of a multimedia network implemented in a home. In this example, a wired communications medium 100 is shown. The wired communications medium might be a coaxial cable system, a power line system, a fiber optic cable system, an Ethernet cable system, or other similar communications medium. Alternatively, the communications medium might be a wireless transmission system. As one example of a wired communication medium, with a Multimedia over Coax Alliance (MoCA®) network, the communications medium 100 is coaxial cabling deployed within a residence 101 or other environment. The systems and methods described herein are often discussed in terms of this example home network application, however, after reading this description, one of ordinary skill in the art will understand how these systems and methods can be implemented in alternative network applications as well as in environments other than the home.

The network of FIG. 1 comprises a plurality of network nodes 102, 103, 104, 105, 106 in communication according to a communications protocol. For example, the communications protocol might conform to a networking standard, such as the well-known MoCA standard. Nodes in such a network can be associated with a variety of devices. For example, in a system deployed in a residence 101, a node may be a network communications module associated with one of the computers 109 or 110. Such nodes allow the computers 109, 110 to communicate on the communications medium 100. Alternatively, a node may be a module associated with a television 111 to allow the television to receive and display media streamed from one or more other network nodes. A node might also be associated with a speaker or other media playing devices that plays music. A node might also be associated with a module configured to interface with an internet or cable service provider 112, for example to provide Internet access, digital video recording capabilities, media streaming functions, or network management services to the residence 101. Also, televisions 107, set-top boxes 108 and other devices may be configured to include sufficient functionality integrated therein to communicate directly with the network.

With the many continued advancements in communications technology, more and more devices are being introduced in both the consumer and commercial sectors with advanced communications capabilities. The introduction of more devices onto a communication network can task the available bandwidth of communication channels in the network. For examples, service providers such as satellite TV providers include MoCA enabled set-top boxes (STBs) and digital video recorders (DVRs) with their systems. By using a high-speed MoCA network to connect DVRs, STBs and broadband access points, the satellite TV providers offer multi-room DVR from a single box and allow access to the Internet to provide streaming video on demand.

To accommodate additional devices the network bandwidth can be divided into different frequency bands to allow some level of simultaneous communication with reduced interference. For example, to operate on existing coaxial runs in the home, MoCA is capable of operating at different frequency bands to avoid existing cable TV signals. For example, in a home with cable TV signals below 1 GHz, MoCA operates above 1125 MHz in a band called D band. In a home with satellite L-band signals above 950 MHz MoCA operates between 475 and 675 MHz in a band called E band. To further reduce interference to existing services, MoCA also features transmit power control (TPC). TPC reduces the MoCA transmit power by up to 30 dB. Reducing transmit power lowers the likelihood that the MoCA signal will cause interference to devices operating in other bands. To further take advantage of the bandwidth provided by the coaxial cabling, channel stacking switch (CSS) technology is often used to re-allocate IF video to another portion of the coaxial cable to provide separate channels for a MoCA home network.

To accommodate multiple devices on a given communication channel, a diplexer can be used. For example, a conventional diplexer includes two or more bandpass filters to allow multiple signals in different frequency bands to share the same communication link and to filter out the unwanted signals before providing the signal to a given device. Such diplexers can provide a frequency division duplexing (FDD) solution.

Additionally, switchable diplexers can be used to allow selective access to the physical layer by different signals in different frequency bands. This is useful in applications where it is desirable to allow multiple devices operating at different frequency bands to share the same coaxial cable network. FIG. 2 is a diagram illustrating an example of a conventional switchable diplexer. Referring now to FIG. 2, this conventional diplexer 200 includes four bandpass filters and six switches to select one of the four bandpass filters for communication. Particularly, this example includes a D-Band bandpass filter 204, an F-Band bandpass filter 206, a D-Low-Band bandpass filter 208, and an E-Band bandpass filter 210. D-Band bandpass filter 204 is configured to pass signals in the 1,125 MHz to 1,675 MHz passband range, and to reject signals outside that passband range. Likewise, the F-Band bandpass filter 206 has a passband of 650 MHz-875 MHz with high rejection requirements in the 1300-2150 MHz range, the D-Low-Band bandpass filter 208 has a passband of 1,125 MHz to 1,225 MHz, and the E-Band bandpass filter 210 has a passband of 475 MHz to 675 MHz and high rejection specification from 950 MHz to 2,150 MHz.

Switches, SW1-SW6 are provided to switch the selected bandpass filter into the signal path. In the illustrated example, three switches SW1, SW2 and SW5 are provided at a first side to switch the signal to/from the desired one of the plurality of bandpass filters 204-210. When configured as shown, switches SW1, SW2 and SW5 are configured to switch the signal to/from E-Band bandpass filter 210. Likewise, at the other side, three switches SW3, SW4 and SW6 are provided to switch the signal to/from the selected bandpass filter onto the signal path. When configured as shown, switches SW3, SW4 and SW6 are configured to switch the output signal to/from E-Band bandpass filter 210 from/onto the communication channel. As used in this document, top-level switches such as switches SW1 and SW4 are referred to as primary switches, while the next level switches SW2, SW3, SW5 and SW 6 are referred to as secondary switches.

BRIEF SUMMARY OF EMBODIMENTS OF THE INVENTION

According to embodiments of the systems and methods described herein, various configurations for switchable bandpass filter and diplexer combinations are provided. In accordance with some embodiments of the systems and methods described herein, a plurality of diplexers and bandpass filters are provided with switches to allow selection of different communication bands for communication over a communication channel. Particularly, in some embodiments, switchable bandpass filter and diplexer combinations are provided to allow communication of network and cable TV signals over a coaxial cable installation. More particularly, in some embodiments, switchable bandpass filter and diplexer combinations are provided to allow communication of MoCA network communications and cable TV signals over a coaxial cable installation.

In some embodiments, a switchable filter and diplexer circuit, includes a plurality of diplexers, each diplexer having a plurality of one or more passbands. For example, in some embodiments, a given diplexer includes a passband for network communications (such as, for example, MoCA network communications) and a passband for cable TV transmission. The switchable filter and diplexer circuit in these embodiments also includes a plurality of bandpass filters having a predetermined passband and stopband. Preferably, at least some of the bandpass filters have a passband different from the passband of the other of the plurality of bandpass filters.

A plurality of switches may be provided and coupled to the diplexers and to the passband filters. The switches may be configured to select one of the plurality of bandpass filters or diplexers for signal communication on a communication channel.

In some embodiments, the bandpass filters are arranged in groups of bandpass filters located adjacent to one another physically, and a group of bandpass filters includes a plurality of bandpass filters having a stop band in a common frequency range of interest.

A variety of different switching arrangements can be provided to allow selection and communication of network and television signals. In one embodiment, the plurality of switches comprise a first pair of switches coupled to the plurality of bandpass filters and diplexers and configured to select one of the bandpass filters and diplexers for network communication, and a third switch having input terminals coupled to the diplexers and configured to select one of the diplexers for TV signal communication. In some embodiments, the third switch is coupled to at least one of the switches of the first pair of switches such that when a given diplexer is selected by the at least one of the switches of the first pair of switches that same diplexer is selected by the third switch.

In various embodiments, the diplexers include a cable TV bandpass filter. The cable TV bandpass filter can include a low-pass filter configured to have a passband of less than or equal to 1002 MHz. In other embodiments, the cable TV bandpass filter can include a low-pass filter configured to have a passband for other TV signals such as, for example, a passband of less than or equal to 864 MHz.

In some embodiments, a switchable filter and diplexer circuit includes a first switch having a common terminal and a plurality of selectable terminals; a second switch having a common terminal and a plurality of selectable terminals; a third switch having a common terminal and a plurality of selectable terminals; a plurality of diplexers, each diplexer having a plurality of passbands and each diplexer having a first terminal connected to one of the plurality of selectable terminals of the first switch, a second terminal connected to one of the plurality of selectable terminals of the third switch, and a third terminal connected to one of the plurality of selectable terminals of the second switch; and a plurality of bandpass filters, the bandpass filters having a predetermined passband, wherein at least some of the bandpass filters have a passband different from the passband of the other of the plurality of bandpass filters, each of the bandpass filters having a first terminal connected to one of the plurality of selectable terminals of the first switch, a second terminal connected to one of the plurality of selectable terminals of the third switch.

In some embodiments, the bandpass filters include an E-band bandpass filter, an F-band bandpass filter and an H-band bandpass filter electrically arranged in parallel relation to one another and the diplexers comprises a first diplexer with a D-band bandpass filter, a second diplexer with a D-low band bandpass filter, and a third diplexer with a D-high band bandpass filter electrically arranged in parallel relation to one another. The diplexers can further include a cable TV bandpass filter having, for example, a low-pass filter configured to have a passband of less than or equal to 1002 MHz.

The bandpass filters may be arranged in groups of bandpass filters located adjacent to one another physically, wherein a group of bandpass filters comprises a plurality of bandpass filters having a stop band in a common frequency range of interest. The bandpass filters can include a plurality of bandpass filters each having an identified rejection frequency range that is at least partially overlapping an identified frequency rejection range of the other bandpass filters in the group. The identified rejection frequency range can be a predetermined frequency range of high rejection.

The bandpass filters and diplexers may be grouped into M groups of N bandpass filters or diplexers each, wherein the first and third switches include a first and third switch pair for each group of bandpass filters or diplexers. The system can further include a first primary switch having a common terminal and at least M selectable terminals, and a second primary switch having a common terminal at least M selectable terminals, wherein corresponding ones of the selectable terminals of the first and second primary switches are connected to the common terminals of the first and third switches for a given group of bandpass filters or diplexers. In some embodiments, N is the same quantity of bandpass filters or diplexers for each of the M groups. In other embodiments, N is a different quantity of bandpass filters or diplexers for one or more of the M groups.

Because it is often desirable to share the channel among components operating at different frequencies, at least some of the bandpass filters have a passband different from the passband of the other of the plurality of bandpass filters. A plurality of switches can be provided to switch the desired bandpass filter into the circuit to allow communication on its corresponding band. The switches can therefore be electrically coupled to the passband filters and configured to select one of the plurality of bandpass filters for signal communication on the communication channel. In various embodiments, the bandpass filters are arranged in groups of bandpass filters located adjacent to one another physically. Further, a group of bandpass filters comprises a plurality of bandpass filters having a stop band in a common frequency range of interest.

In some configurations multi throw switches can be used to switch a bandpass filter with a desired into and out of the circuit with one level of switches. In other configurations, the switches are provided as primary-level switches and secondary switches. The primary switches can be used to select groups of bandpass filters into and out of the circuit; the secondary switches can be used to select a given bandpass filter within the group. Accordingly, in some embodiments, the plurality of bandpass filters in a given group of bandpass filters share common secondary switches. In further embodiments, additional levels of switching can be provided such as, for example, to accommodate subgroups of bandpass filters. To provide additional isolation, some embodiments can be provided in which none of the plurality of bandpass filters in a given group share a common secondary switch with a bandpass filter in another group.

In one example embodiment, the groups of bandpass filters include at least two groups of at least two bandpass filters each, and the switches include primary switches and secondary switches. In a further example, the switchable diplexer includes two primary switches each connected to a communication link and configured to switch one of the two groups into the communication link; and a pair of secondary switches for each group of bandpass filters, each pair of secondary switches having a first secondary switch coupled to one of the primary switches and a second secondary switch coupled to the other of the primary switches, each pair of secondary switches configured to select one of the two bandpass filters in their respective group.

The switchable diplexer in various embodiments is scalable depending on system requirements and the groups of bandpass filters can include M groups of N bandpass filters each (where M, N are integer numbers). The number of bandpass filters N in each of the M groups can be the same across all groups or it can vary for one or more of the groups. In other words, in some embodiments N is the same quantity for each of the M groups of bandpass filters, while in other embodiments, N is different for one or more of the M groups. In embodiments with primary and secondary switches, there can be two primary switches each connected to a communication link and configured to switch one of the M groups into the communication link. There can also be included a pair of secondary switches for each of the M group of bandpass filters, each pair of secondary switches having a first secondary switch coupled to one of the primary switches and a second secondary switch coupled to the other of the primary switches, each pair of secondary switches configured to select one of the N bandpass filters in their respective group.

In embodiments with primary and secondary switches are used, in some embodiments when the primary switches are configured to select one of the groups of bandpass filters, the other of the M groups of bandpass filters are deselected by the primary switches, and further wherein each pair of secondary switches for the deselected groups of bandpass filters are set in a complementary configuration.

In various embodiments, bandpass filters can be cascaded with a diplexer to create a cascaded diplexer leg with selectable passbands. This can, in some embodiments, simplify the design and alleviate the need for switching to select TV bands at the diplexer output while still allowing multi-band network support.

In one embodiment, a cascaded diplexer circuit, includes a diplexer comprising a plurality of first bandpass filters each having a passband; and a second bandpass filter having a passband and two terminals, and coupled in series with a determined one of the first bandpass filters of the diplexer; and first and second switches coupled in series with the second bandpass filter and the determined one of the first bandpass filters of the diplexer, and configured to selectably switch the second bandpass filter into the circuit. Preferably, the passband of the second bandpass filter is chosen to limit the passband of the determined one of the first bandpass filters, such that when the second bandpass filter is switched into the circuit, the passband of the diplexer leg is reduced. In some embodiments, the passband of the second bandpass filter is a subset of, or overlaps with, the passband of the determined one of the first bandpass filters.

The cascaded diplexer circuit can be further configured to include a plurality of additional bandpass filters connected in parallel with the diplexer and second bandpass filter, the additional bandpass filters having a predetermined passband; and second and third switches coupled to the additional passband filters and to the diplexer and second bandpass filter circuit leg, the second and third switches configured to select one of the plurality of additional bandpass filters or the diplexer and second bandpass filter circuit leg for signal communication on a communication channel.

A shunt can be included and coupled between the first and second switches and arranged in parallel circuit relation to the second bandpass filter to allow the second bandpass filter to be effectively removed from the circuit. Also, a third bandpass filter can be included and coupled between the first and second switches and in parallel circuit relation to the second bandpass filter. Additional bandpass filters can also be provided. The first and second switches can be configured to selectably connect the second bandpass filter, the third bandpass filter or the shunt into the circuit. In some embodiments, the first and second switches are configured to selectably connect the second bandpass filter or the third bypass filter into the circuit.

In other embodiments, a cascaded diplexer circuit includes: diplexer comprising a common terminal and first and second band-specific terminals, and further comprising a first bandpass filter coupled between the common terminal and the first band-specific terminal and a second bandpass filter coupled between the common terminal and the second band-specific terminal, the bandpass filters having a passband and a stop band; a third bandpass filter having first and second terminals, wherein the first terminal of the third bandpass filter is coupled to the first band-specific terminal of the diplexer; and a first switch having a common terminal coupled to the first band-specific terminal of the diplexer and a first selectable terminal coupled to a first terminal of the third bandpass filter, wherein the switch is configured to selectably switch the third bandpass filter into and out of the diplexer circuit. Preferably, in some embodiments, the passband of the third bandpass filter limits the passband of the first bandpass filter. Accordingly, the passband of the third bandpass filter can be a subset of, or overlap with, the passband of the first bandpass filter.

The cascaded diplexer circuit can further include a plurality of additional bandpass filters connected in parallel with the diplexer and third bandpass filter, the additional bandpass filters having a predetermined passband; and second and third switches coupled to the additional passband filters and to the diplexer and third bandpass filter circuit leg, the second and third switches configured to select one of the plurality of additional bandpass filters or the diplexer and third bandpass filter circuit leg for signal communication on a communication channel.

The cascaded diplexer circuit can also include a second switch having a first selectable terminal coupled to a second terminal of the third bandpass filter, and a shunt arranged in parallel circuit relation to the third bandpass filter and coupling between a second selectable terminal of the first switch and a second selectable terminal of the second switch. A fourth bandpass filter coupled between the first and second switches can also be included and arranged in parallel circuit relation to the third bandpass filter. In some embodiments, the first and second switches are configured to selectably connect the third bandpass filter, the fourth bandpass filter or the shunt into the circuit.

The cascaded diplexer circuit can also include a fourth (or more) bandpass filter coupled between the first and second switches and in parallel circuit relation to the third bandpass filter. In such embodiments, the first and second switches can be configured to selectably connect the fourth bandpass filter or the third bypass filter into the circuit. The additional bandpass filters can include at least one of an E-band bandpass filter, an F-band bandpass filter and an H-band bandpass filter electrically arranged in parallel relation to one another.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the accompanying figures. The drawings are provided for purposes of illustration only and merely depict typical or example embodiments of the invention. These drawings are provided to facilitate the reader's understanding of the systems and methods described herein and shall not be considered limiting of the breadth, scope, or applicability of the claimed invention.

Figure 1:
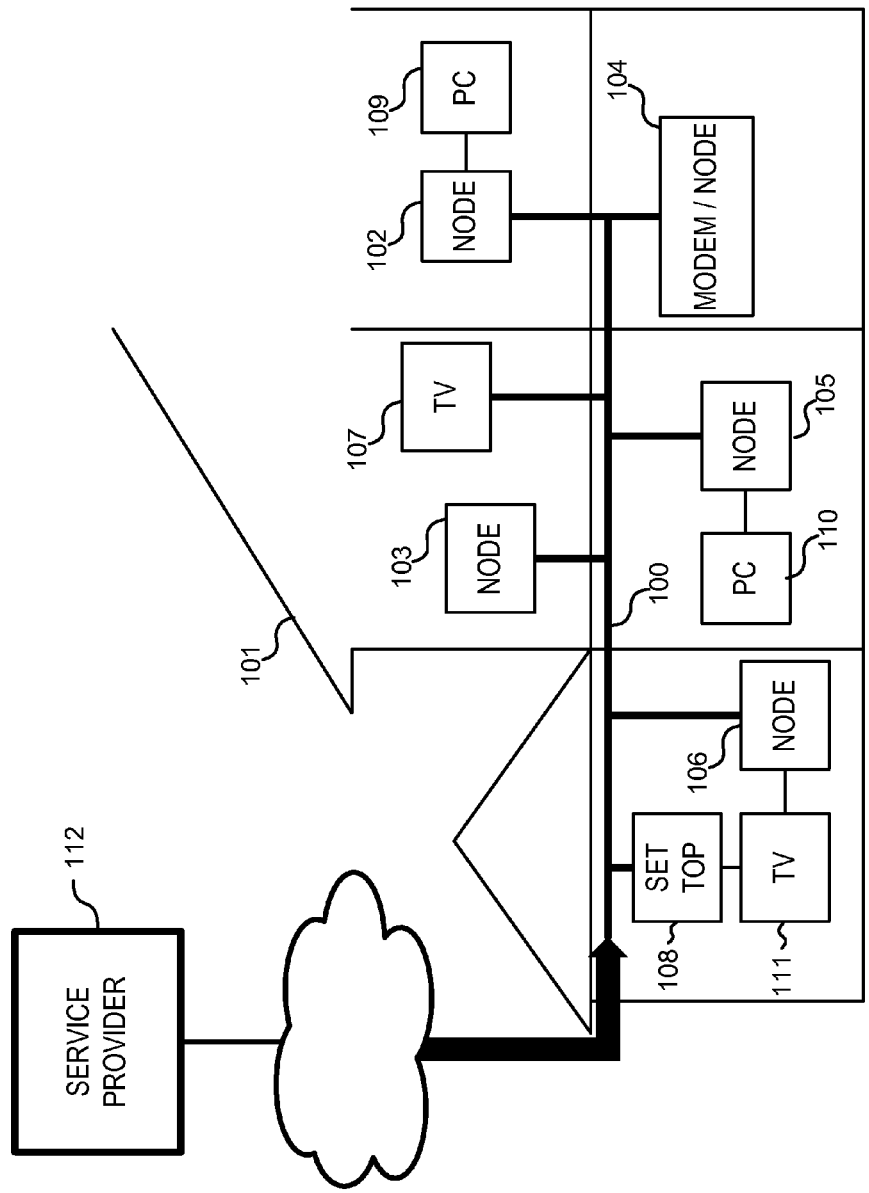
FIG. 1 is a diagram illustrating one example of a home network environment with which the systems and methods described herein can be implemented.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

Systems and methods described herein include a switchable diplexer configured in some embodiments to provide a low insertion loss relative to conventional solutions. Because of crosstalk between diplexer elements used in switchable diplexers, the switching components of switchable diplexers are often specified to have a high enough degree of isolation to reduce or minimize the adverse effects of signals bleeding through onto an adjacent diplexer channel. Configuration of the switchable diplexer to provide placement of components such that bandpass filters having like passbands are placed adjacent one another helps to reduce the effects of unwanted crosstalk interference between the bandpass filter elements.

The diplexers according to the systems and methods describe herein include a plurality of bandpass filters that are used to allow signals of certain frequencies to pass while rejecting, or filtering out, signals in other frequency bands. The bandpass filters pass signals within a certain band of frequencies of a desired bandwidth. This is known as the pass band of the bandpass filter. The bandwidth is typically defined as the frequency range between two cut-off points. The frequency cutoff points are typically 3 dB below the maximum center or resonant peak, although other parameters can be used to specify the operable passband of the bandpass filter. Frequency ranges outside the passband are often referred to as the stop band of the bandpass filter. With some filters there may be a transition region between the passband and the stop band. In most applications, the bandpass filter is used to allow frequencies within the passband to be passed through the filter while rejecting, or filtering out, unwanted frequencies outside the passband.

In addition to specifying a passband, bandpass filters may specify a level of rejection (typically in dB) for the stop band. Also, one or more frequency ranges of high rejection may be specified to filter out signals in a frequency range of particular interest. The level of rejection specified as being a high level of rejection for the filter depends on the system application and the signals anticipated on the communication channel. For example, it may be known in a given application that signals in a certain frequency range may be present and that such signals, if allowed to pass, would cause interference on the channel with desired signals in the passband. As such, the system designer would specify a sufficient level of rejection in that band (or across a wider band) to reduce the interference to a desired level to allow system performance to meet specifications. For example, in some applications such as in MoCA, the specification for high rejection in the 1300-2150 MHz range for F-Band bandpass filter 206 can be 65 dB, while the specification for high rejection in the 950-2150 MHz range for E-band bandpass filter 210 can be 60 dB. As one of ordinary skill in the art will understand, other levels of isolation can be specified for a frequency range of high rejection. Note that in some applications, the entire stop band may be specified as requiring a high level of rejection.

Figure 2:
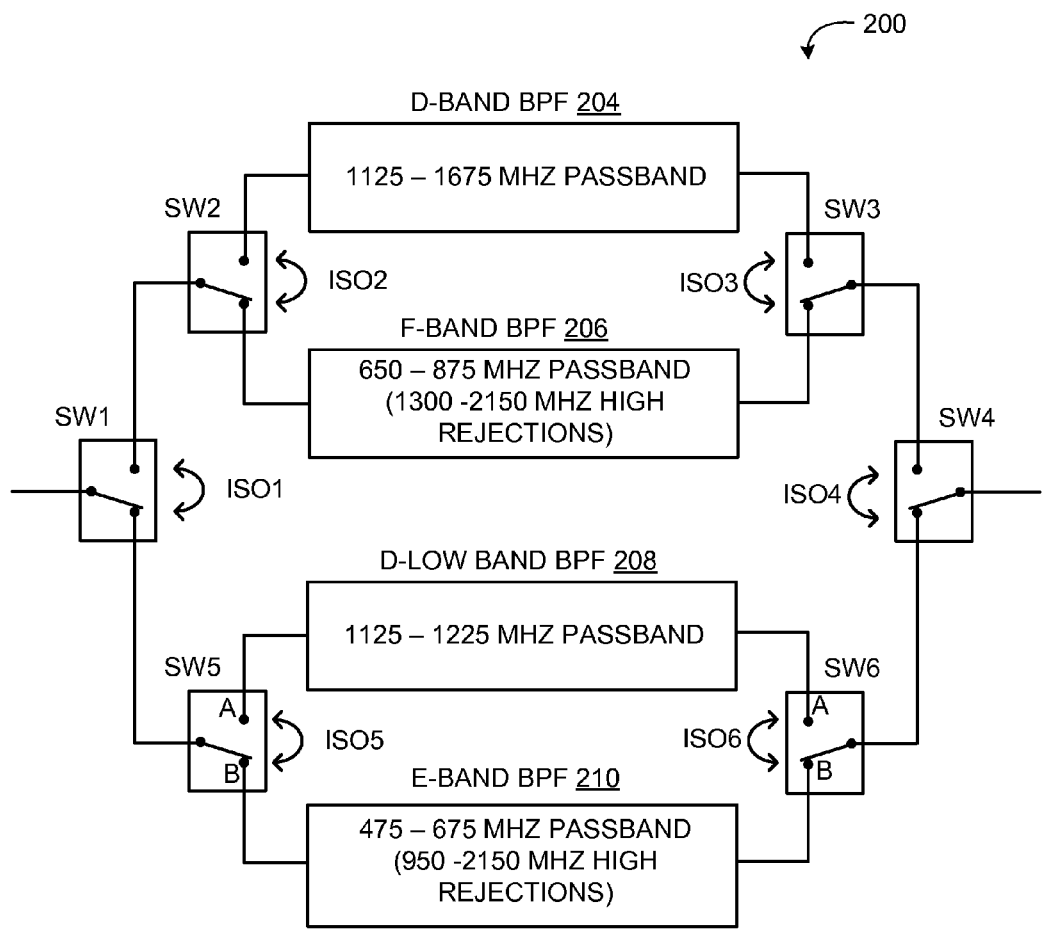
FIG. 2 is a diagram illustrating one example of a conventional switchable diplexer.

Conventional designs such as that shown in FIG. 2 alternate the placement of bandpass filters so that filters having different passbands are placed adjacent to one another physically. This is done with conventional switchable diplexers to reduce coupling or crosstalk for better isolation. Accordingly, in the example of FIG. 2, the physical layout of bandpass filters 204-210 would be similar to the layout shown in the schematic diagram, in which D-Band bandpass filter 204 and D-Low band bandpass filter 208 are physically separated from each other to avoid cross talk between signals within the overlapping frequency range of their respective passbands.

However, as a result, bandpass filters with different and non-overlapping passbands are typically placed adjacent one another. Due to crosstalk between adjacent bandpass filters, signals filtered out or rejected by the selected bandpass filter may be coupled into an adjacent bandpass filter and pass through the output switch and onto the signal path. This phenomenon can be illustrated with the example configuration shown in FIG. 2. With continued reference to FIG. 2, consider the case as illustrated in which a broadband signal is input into switchable diplexer 200 at switch SW1, is routed to switch SW5, which in turn, routes the signal to E-Band bandpass filter 210. E-Band bandpass filter 210 passes the portion of the signal from 475 MHz to 675 MHz to switch SW6. E-Band bandpass filter 210 blocks portions of the signal outside its passband frequency band in accordance with the filter characteristics. For example, in one application, E-Band bandpass filter 210 blocks signals in the 950 MHz-2150 MHz by 60 dB or greater.

However, because of the proximity of D-Low Band bandpass filter 208 to E-Band bandpass filter 210 and the crosstalk between them, unwanted signals can couple into D-Low Band bandpass filter 208. Particularly, portions of the signal in the stop band of E-Band bandpass filter 210 that are in the passband of D-Low Band bandpass filter 208 can couple onto and be passed by D-Low Band bandpass filter 208. This can be particularly problematic in the instant example where frequency range specified as the high-rejection range of E-band bandpass filter 210 overlaps to a large extent with the pass band of D-low band bandpass filter 208. Accordingly, signals in this area of specified high rejection can couple into and be passed by D-low band bandpass filter 208, degrading the effective rejection in that band.

To avoid having this crosstalk signal appear at the output of the switchable diplexer 200, system designers typically specify output switches with a high enough level of isolation to avoid this unwanted signal from coupling across the terminals of the switch and onto the output signal lines. Continuing with this particular example, E-band bandpass filter 210 requires high rejection in the 950 MHz-2150 MHz range (for example, 60 dB), which overlaps with the passband of the D-Low Band bandpass filter 208 (1,125 MHz-1,225 MHz). Therefore, the combined isolation ISO5+ISO6 of switches SW5 and SW6 needs to be large enough to sufficiently isolate D-low band bandpass filter 208. Consider an example where the high rejection is specified as being 60 dB. In this example, because of coupling from E-band bandpass filter 210 to D-low band bandpass filter 208, the combined switch isolation for switches SW5 and SW6 needs to be on the order of approximately 70 dB (60 dB+10 dB margin) in order to preserve the integrity of E-Band bandpass filter 210.

Accordingly, SW5 and SW6 would be typically specified with sufficient isolation ISO6 between terminals A and B such that unwanted signals will not couple between terminal B and terminal A. Likewise, the other switches SW1-SW5 are also specified with sufficient isolation to avoid similar coupling of unwanted signals. For example, F-band bandpass filter 204 requires high rejection (for example, 65 dB) in the 1,300 MHz-2,150 MHz range, which covers the passband of the D-band bandpass filter (1,125 MHz-1,225 MHz). Therefore the combined isolations of SW2 and SW3 (ISO2 and ISO3) needs to be in the 75 dB range (65+10) in order to preserve the integrity of F-band bandpass filter 204. Switches with these levels of isolation are costly and can drive up the cost of the switchable diplexer 200.

One solution to reduce or eliminate unwanted filter crosstalk would be to provide a large enough degree of physical separation between the bandpass filters to reduce or eliminate the crosstalk between them. However, packaging constraints typically require that the bandpass filters be placed in close enough proximity to one another such that crosstalk needs to be addressed. Therefore, according to one embodiment of the systems and methods described herein, the bandpass filters are arranged counter-intuitive to conventional wisdom. Particularly, in some embodiments, the bandpass filters are arranged such that filters with like passbands are placed adjacent to one another, and filters with differing passbands are preferably separated from one another. In other embodiments, the bandpass filters are arranged such that a filter with a specified high rejection in a given frequency range is placed adjacent a bandpass filter for which that same frequency range is in its stop band. In yet other embodiments, the bandpass filters are arranged such that bandpass filters with like stop bands are placed adjacent to one another.

In some embodiments, the placement is made to the extent practical considering packaging, layout, and other constraints that may exist for the switchable diplexer. For example, in some applications, packaging, layout or other constraints may require that one or more bandpass filters be placed adjacent to one or more other bandpass filters having differing passbands.

In some embodiments, two bandpass filters are considered to have differing passbands where the passbands of the two bandpass filters are completely non-overlapping. In other embodiments, two bandpass filters are considered to have differing passbands where the passbands of the two bandpass filters are only partially non-overlapping. In some embodiments, two bandpass filters are considered to have like passbands where the passband of one filter is the same or substantially the same as the passband of the other filter. In other embodiments, two bandpass filters are considered to have like passbands where the passband of one filter overlaps some or all of the passband of the other filter, or where the passband of one filter is a subset of the passband of the other filter. Accordingly, overlap of frequency bands can include the partial or complete overlap by one band of one filter with a frequency band of another filter.

In some embodiments, the amount of overlap for a band of one filter to be considered like a band of another filter is determined by a percentage of overlap by one band of the other. For example, 50%, 60%, 70%, 80%, 90% or greater overlap may be considered sufficient overlap of frequency bands for two filters to be deemed to have like passbands or stop bands.

In many embodiments, the passbands and stop bands of the filters, as well as bands of high rejection, are defined by the network parameters. Accordingly, a certain percentage of overlap may not be attainable for each adjacent filter, but adjacencies instead determined based on optimizing the layout given the passband and stopband ranges provided. Filter layout and adjacencies can be determined by choosing the arrangement that minimizes stop-band crosstalk among the filters. In further embodiments, Filter layout and adjacencies can be determined by choosing the arrangement that minimizes stop-band crosstalk for high rejection bands.

Figure 3:
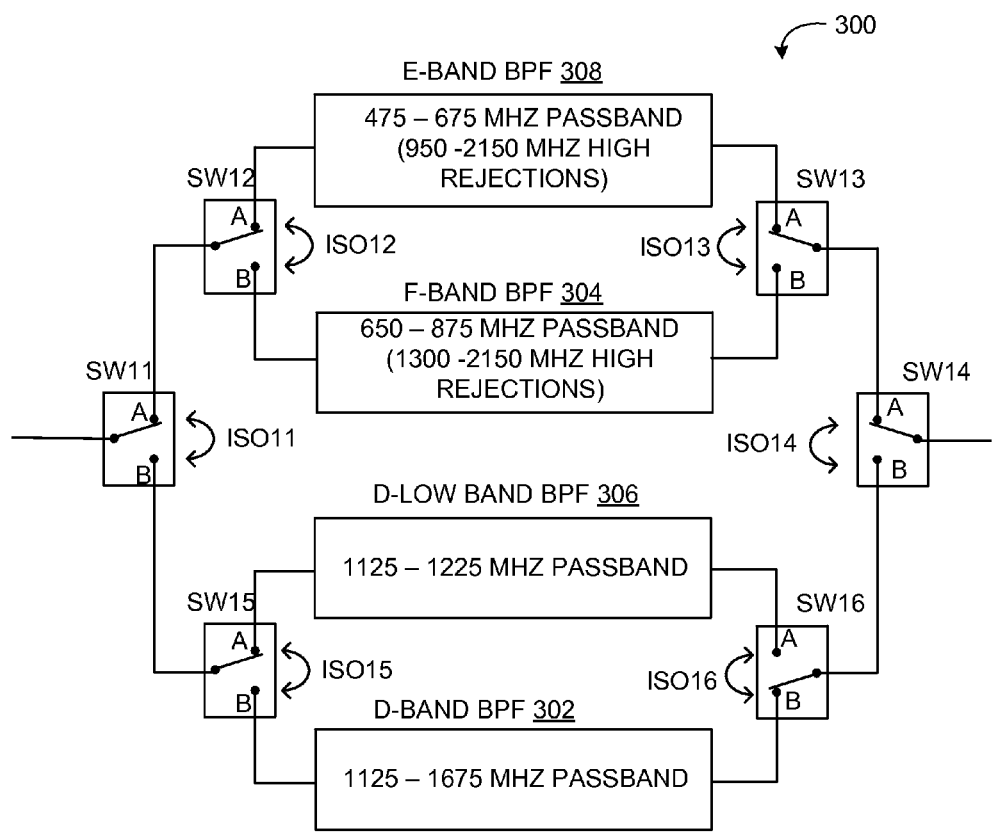
FIG. 3 is a diagram illustrating an example of a switchable diplexer in accordance with one embodiment of the systems and methods described herein.

FIG. 3 is a diagram illustrating an example bandpass filter layout of a switchable diplexer in accordance with one embodiment of the systems and methods described herein. In the example illustrated in FIG. 3, the bandpass filters are arranged such that filters with like stopbands are placed adjacent to one another, and filters with differing stopbands are separated from one another. Referring now to FIG. 3, the illustrated switchable diplexer 300 includes bandpass filters 302-308 and switches SW11-SW16. Like the example shown in FIGS. 2, E, F and D bands are accommodated and switches SW11-SW16 are provided to switch the selected bandpass filter into the signal path. In the illustrated example, three switches SW11, SW12 and SW15 are provided at one side to switch the signal into/from the desired one of the plurality of bandpass filters 304-310. When configured as shown, primary switch SW11 and secondary switches SW12 and SW15 are configured to switch the signal into/from E-Band bandpass filter 308. Likewise, at the other side, three switches, primary switch SW13 and secondary switches SW14, SW16, are provided to switch the signal to/from the selected bandpass filter from/to the signal path. When configured as shown, switches SW13, SW14 and SW16 are configured to switch the signal from E-Band bandpass filter 308 to/from the communication channel.

As illustrated in the example of FIG. 3, bandpass filters are arranged in groups such that bandpass filters with like stop bands (or with like passbands) are positioned adjacent one another rather than in an alternating configuration. Therefore, signals outside the passband of the selected filter are either completely outside the passband of the adjacent filter or only partially overlapping the passband of the adjacent filter.

With continued reference to FIG. 3, in this example E-band bandpass filter 308 is positioned adjacent F-Band bandpass filter 304, and D-Band bandpass filter 302 is positioned adjacent D-low band bandpass filter 306. The passband of E-band bandpass filter 308 (475 MHz-675 MHz) is entirely contained with the passband of F-band bandpass filter 304 (650 MHz-875 MHz) and therefore, only a portion of those rejected signals outside of the passband of E-band bandpass filter 308 are within the passband of F-band bandpass filter 304. Moreover, none of the signals rejected by the passband of F-band bandpass filter 304 are within the passband of E-band bandpass filter 308. More importantly in this example, the frequency range for which high rejections are specified for E-band bandpass filter 308 (950 MHz-2150 MHz) is completely outside the passband (i.e. it falls in the stopband) of F-Band bandpass filter 304. Likewise, the frequency range for which high rejections are specified for F-band bandpass filter 304 (650 MHz-875 MHz) is completely outside the passband of E-band bandpass filter 308. Therefore, even if signals in the stop band of E-band bandpass filter 308 were to couple into the signal path of F-band bandpass filter 304, those signals would be rejected by the stop band of F-band bandpass filter 304.

More particularly, consider an example of a broadband signal input to switch SW 12. If the portion of that signal in the stop band of E-band bandpass filter 308 were to couple through switch SW12 to F-band bandpass filter 304, that signal would be rejected by the stop band of F-band bandpass filter 304. Likewise, if through crosstalk the signal were to couple from of E-band bandpass filter 308 to F-band bandpass filter 304, that signal would be rejected by the stop band of F-band bandpass filter 304.

As illustrated in the example of FIG. 3, the high rejection area of E-band bandpass filter 308 is not a part of the passband of F-Band bandpass filter 304, and vice versa. Therefore the Isolation requirements (ISO2+ISO3) of the Switches are reduced over the conventional solution illustrated in FIG. 2. In some embodiments, for example, the isolation requirements ISO2+ISO3 can be reduced to the 30 dB range. In other applications, the isolation requirements ISO2+ISO3 can be reduced to other levels depending on the bandpass filters used, and system requirements.

Accordingly, switchable diplexer 300 can be implemented to reduce the effects of parasitic coupling and to improve isolation by the physical placement and arrangement of the bandpass filters. For example, where the diplexer has a first bandpass filter having a high rejection requirement and second bandpass filter that has a passband covering the first filter's high rejection band, these bandpass filters are arranged such that they are not physically close to each other. For example, they are arranged as remotely from one another as layout, packaging and overall package size constraints allow. In the illustrated example, to accomplish this the filters are grouped according to similarities of passbands or stop bands.

Arranging the bandpass filters in groups to position the bandpass filters adjacent other bandpass filters with like passbands or like stop bands can improve signal isolation as described further below. In one embodiment, the bandpass filters can be arranged in M groups, and each group can comprise N bandpass filters. In the example depicted in FIG. 3, M=2 and N=2; that is, the bandpass filters are arranged in 2 groups and each group includes 2 bandpass filters. In some embodiments, the number of bandpass filters N in each group is the same across all groups. In other embodiments, the number of filters N in each group can vary from group to group (i.e., N can be different for one or more groups). Spacing between bandpass filters in the switchable diplexer can vary or it can be constant. For example, in one embodiment filter spacing can be constant across the entire switchable diplexer. In another embodiment, spacing between filters can vary. In yet another embodiment, spacing between filters of adjacent groups can be greater than or less than spacing of filters within a group. It is noted that description herein of arrangement in terms of groups refers to adjacency of filters and does not require particular spacing of filters within a group or between different groups.

In some embodiments, where the packaging or sizing constraints permit, spacing between bandpass filters 306 and 304 can be increased to minimize crosstalk between them. Also, in some embodiments, spacing between bandpass filters 302 and 306 and between bandpass filters 304 and 308 can be decreased over conventional solutions.

Another benefit of the example illustrated in FIG. 3 is that provided by increased switch isolation. In the example of FIG. 2, in E-Band operation, unwanted signals coupled into D-band bandpass filter 204 are isolated from the output by two switches SW5 and SW6. Likewise, in other bands of operation, isolation is similarly provided by two switches.

In the example of FIG. 3, the isolation provided by the switches can be increased. By arranging SW15 and SW16 into opposite, or complementary, positions (as illustrated) when the signal is passing thru SW12 & SW13, (i.e., in E- or F-band operation), isolation is maintained by 3 switches (ISO1+ISO4+ISO5) (or ISO1+ISO6+ISO5) instead of 2 switches in the conventional design. Therefore isolation performance is improved over the conventional design or lower isolation switches can be used to achieve the same levels of unwanted signal isolation. Table 1 is a table illustrating an example configuration of switches for switchable diplexer 300 using the complementary positioning of secondary switches SW12, SW13, SW15 and SW16. Note, in implementations where there are more than 2 bandpass filters in a given group, the complementary position for the secondary switches comprises switch positions in which none of the bandpass filters in the group is selected by the switches at both ends.

TABLE 1

| SW11 | SW14 | SW12 | SW13 | SW15 | SW16 |
|------|------|------|------|------|------|
| A | A | A | A | A | B |
| A | A | A | A | B | A |
| A | A | B | B | A | B |
| A | A | B | B | B | A |
| B | B | A | A | A | B |
| B | B | A | A | B | A |
| B | B | B | B | A | B |
| B | B | B | B | B | A |

Note, also that even though the passband of D-low band bandpass filter 306 over laps with the high rejection region of F-band bandpass filter 304 the effects of any crosstalk between them is isolated by the isolation ISO11 provided by switch SW11 on the first end and by switches SW16 and SW14 at the other end (ISO14 and ISO16). In other words, F-band bandpass filter 304 and D-band bandpass filter 306 use separate secondary switches. This can be contrasted to the conventional solution in which the bandpass filters with the high rejection requirements (206 and 210) are paired with a bandpass filter having a passband overlapping that region (filters 204 and 208, respectively). In the example of FIG. 2, each pair shares the same terminal of the primary switches SW1 and SW4, and no isolation between them is provided by these primary switches. Also, each pair shares the same secondary switches—i.e., secondary switches SW12 and SW13 for filter pair 204, 206, and secondary switches SW15 and SW16 for filter pair 208, 210. In other words bandpass filters 204 and 206 are on the same switch branch and no isolation from crosstalk between them is provided by primary switches SW11 or SW14. The same is true for bandpass filters 208 and 210.

Although the example illustrated in FIG. 3 uses multiple SPDT (single pole double throw) switches, other embodiments with different switching arrangements can be used. For example the three input switches SW11, SW12, SW15 can be replaced by a single SP4T switch (not shown) to provide selectable switching of the signal to one of the four bandpass filters 302, 304, 306, 308. Likewise, an SP4T switch can replace the three SPDT switches SW13, SW14, SW16 at the output. As would be apparent to one of skill after reading this description, other switch configurations can be used for diplexers having a different number of bandpass filters. For example, an SPXT switch can be used to select from among X bandpass filters in a switchable diplexer, where X represents the number of bandpass filters.

Multi-throw switches typically exhibit different isolations between different terminal pairs for a given frequency range. In various embodiments, the contacts of the multi-throw switch assigned to each bandpass filter can be selected based on the relative isolations between pairs of those contacts.

Figure 4:
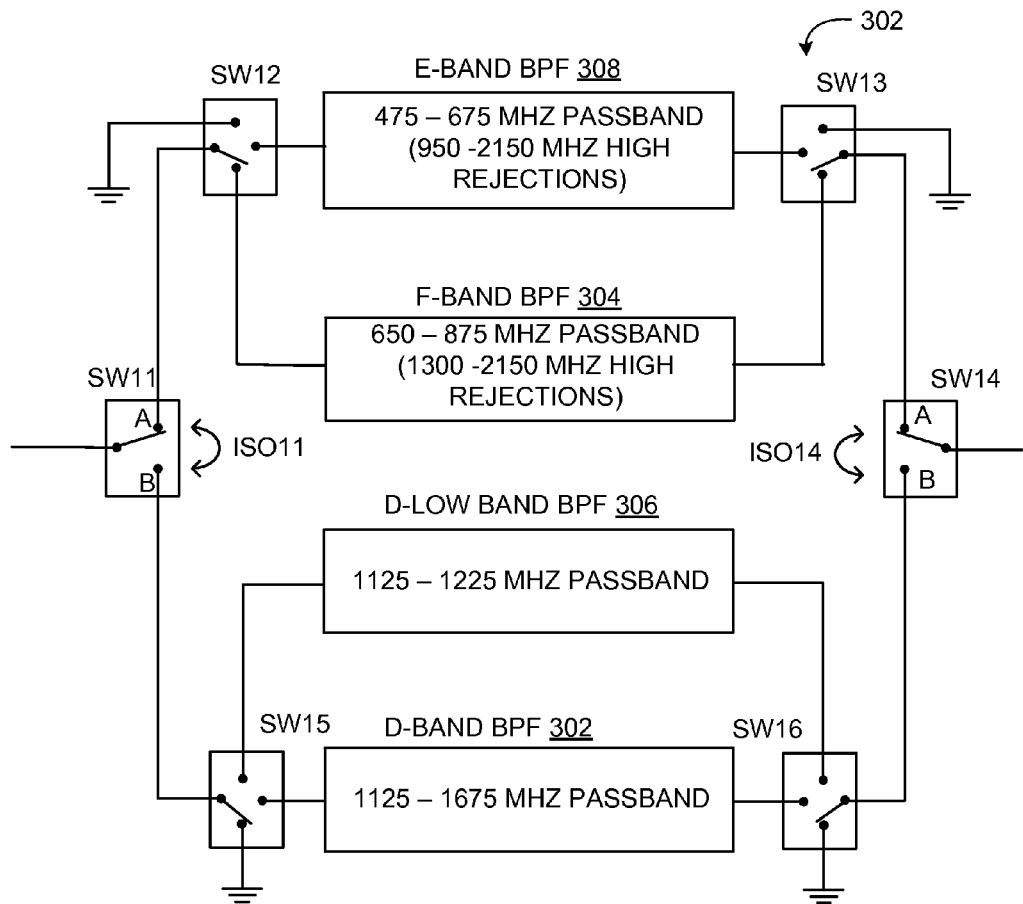
FIG. 4 is a diagram illustrating an example of a switchable diplexer in accordance with another embodiment of the systems and methods described herein.

In yet another embodiment, the switches can be configured to include an additional position to improve isolation. In operation, for an unused branch of the diplexer circuit, the switches can be placed in the unused position to increase isolation. Additionally, this unused position can be grounded to further improve isolation. FIG. 4 is a diagram illustrating an example of this alternative embodiment. Referring now to FIG. 4, in this example, the secondary switches SW12, SW13, SW15 and SW16 include an additional position that is tied to a signal ground. That is secondary switches SW12, SW13, SW15 and SW16 each include at least one position for each branch and at least one additional position that is tied to signal ground. In operation, when one or more branches of the switchable diplexer are unused, the secondary switches serving those branches can be switched to the grounded position, thereby improving the isolation provided.

For example, in the embodiment illustrated in the example of FIG. 4, primary switches SW11 and SW14 are set to select the upper branches of the switchable diplexer 302. Isolation from these switches ISO11 and ISO14 provides a given level of signal isolation from the two D-band branches. Additionally, switches SW15 and SW16 are set to the grounded position as shown to provide further signal isolation for a portion of the signal that might pass through the isolation ISO11 and ISO14 provided by primary switches SW11 and SW14. Similarly, if primary switches SW11 and SW14 were set to select the D-band branches of switchable diplexer 302, then secondary switches SW12 and SW13 could be set to their respective grounded positions to provide isolation from unwanted signals in those branches.

In further embodiments, conventional multi-band diplexers can be combined with switchable diplexers to provide enhanced functionality. In such embodiments, a combination of bandpass filters, diplexers and switches are provided to support communication and selection of multiple bands. For example, in a video distribution network such as a home or office cable TV installation, conventional diplexers can be provided to allow CATV signals to share the coaxial cable runs with MoCA or other network traffic. These diplexers can also be combined with switching capability to allow selection of a desired band for network traffic. In still further embodiments, these diplexers can be combined with additional filters and switching capabilities to provide further support for additional network bands.

Figure 5:
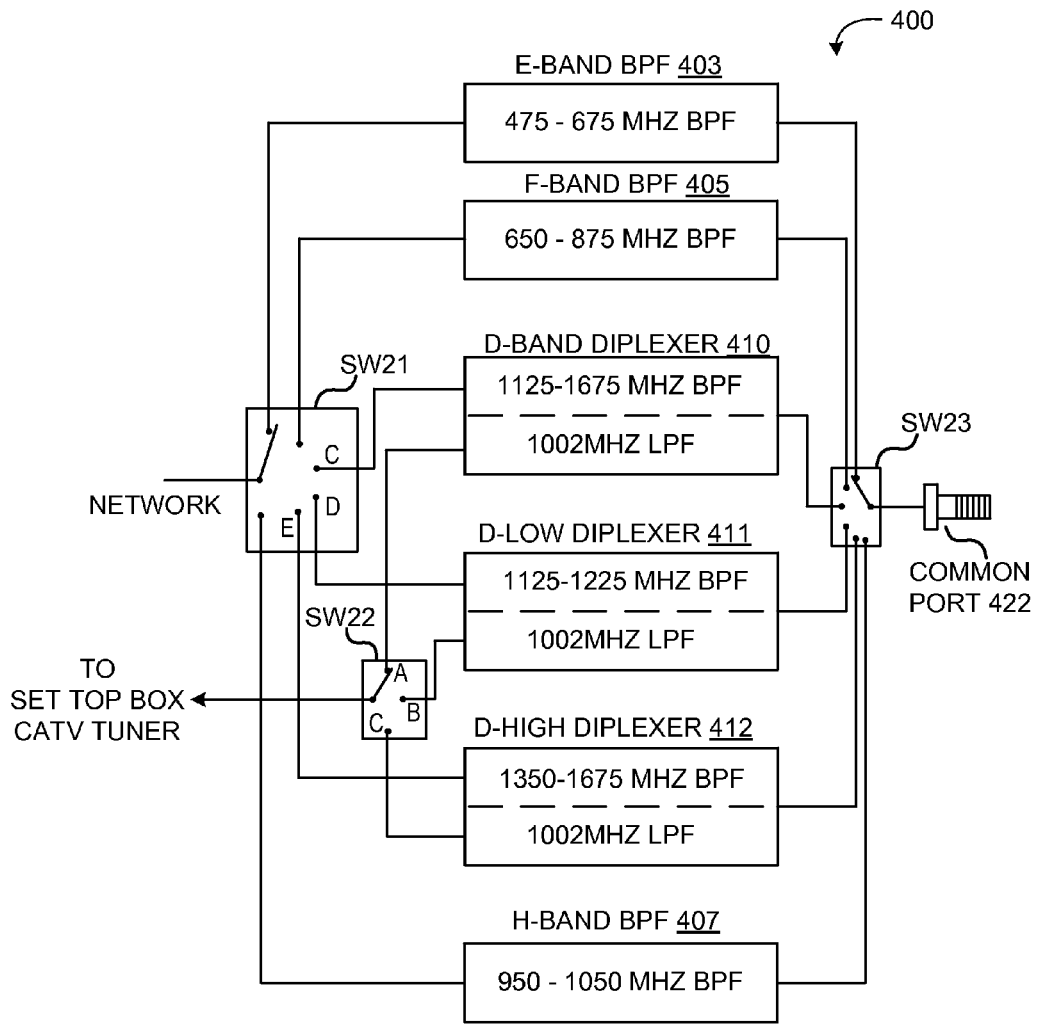
FIG. 5 is a diagram illustrating an example of a combination switchable diplexer in accordance with one embodiment of the systems and methods described herein.

FIG. 5 is a diagram illustrating an example implementation of such a combination of bandpass filters, diplexers and switches to address multiple bands. The illustrated example supports cable TV signals as well as the following MoCA bands: Extended-D; D-low; D-high; E, F and H. This example implementation is now described with reference to FIG. 5. After reading this description, it will become apparent to one of ordinary skill in the art how the combination of diplexers and switches and filters can be implemented using other filters, other diplexers, and other arrangements of components. The example of FIG. 5 includes three bandpass filters 403, 405, and 407, 3 diplexers 410, 411, and 412, and three switches SW21, SW22, and SW23. E-band bandpass filter 403 as a passband range of 475 675 MHz, F-band bandpass filter 405 has a passband range of 650 MHz-875 MHz, and H-band bandpass filter 407 has a passband range of 950 MHz-1050 MHz. The cable TV and D-band frequency bands are accommodated using three diplexers 410, 411 and 412. Diplexers 410, 411, 412 are each configured to handle two different frequency bands. D-band diplexer 410 is configured to pass D-band signals from 1125 MHz-1675 MHz, and cable TV signals below 1002 MHz. D-low band diplexer is configured to pass signals in the 1125 MHz-1225 MHz passband as well as cable TV signals below 1002 MHz. D-high band diplexer is configured to pass signals in the 1350 MHz-1675 MHz passband and cable TV signals below 1002 MHz. In other embodiments, the diplexers can include a low-pass filter configured to have a passband for other TV signals such as, for example, a passband of less than or equal to 864 MHz.

The combination diplexer 400 can be used to provide communications of network signals (such as, for example, MoCA signals) in combination with cable TV signals. In the illustrated example, diplexer 400 is connected to the coaxial cable at common port 422. Common port 422 can be, for example, an F connector at the wall outlet, or other coaxial cable sourcing cable TV signals and connected to network equipment. Accordingly combination diplexer 400 can receive cable TV signals as well as network signals through common port 422 and distribute cable TV signals and network signals at its output on the left-hand side of the page. Although cable TV signals are generally provided in one direction, networking signals, including the example MoCA network signals, may involve bidirectional communication.

With continued reference to FIG. 5, example operational scenarios are now described. In this example configuration, switches SW21 and SW23 are single-pole-six-throw (SP6T) switches that can be used to select one of the available communication bands: E-band, F-band, H-band or the D-bands.

When either of the D-band, D-low band or D-high band are selected in this example, cable TV signals at or below 1002 MHz are also passed through the combination diplexer 400 by the respective diplexer 410, 411, or 412. Accordingly, switch SW22, which in this example is a single pole triple throw (SP3T) switch, is used in conjunction with switches SW21 and SW23 to select the appropriate diplexer 410, 411, 412 to pass the cable TV signals. In some embodiments switches SW21, SW23 are configured through mechanical or electronic coupling to choose the same bandpass filter or diplexer. In further embodiments switch SW22 is coupled mechanically or electronically to either or both switches SW21, SW23 such that when a D-band diplexer is selected for network communications, the same D-band diplexer is selected by SW22 to allow the cable TV signals to pass through to the set-top box or other cable TV tuner.

For example, in some embodiments, switches SW21 and SW22 can be implemented as a ganged switch or as a double pole switch such that when one of terminals C, D or E of switch SW21 is selected, the corresponding terminal A, B or C of switch SW22 is also selected. In other embodiments, a processor or other controller can be used to control the switching through the use of control signals, and the control signals can be configured to be sent to switches SW21 and SW22 to control the switch selection in a coordinated manner. Accordingly, when the controller causes one of terminals C, D or E of switch SW21 to be selected, it also causes the corresponding terminal A, B or C of switch SW22 to be selected. This can be accomplished by routing the same control signals to both switches, or by configuring (e.g., programming) the controller to send the appropriate control signals to both switches to achieve this coordination.

Figure 6:
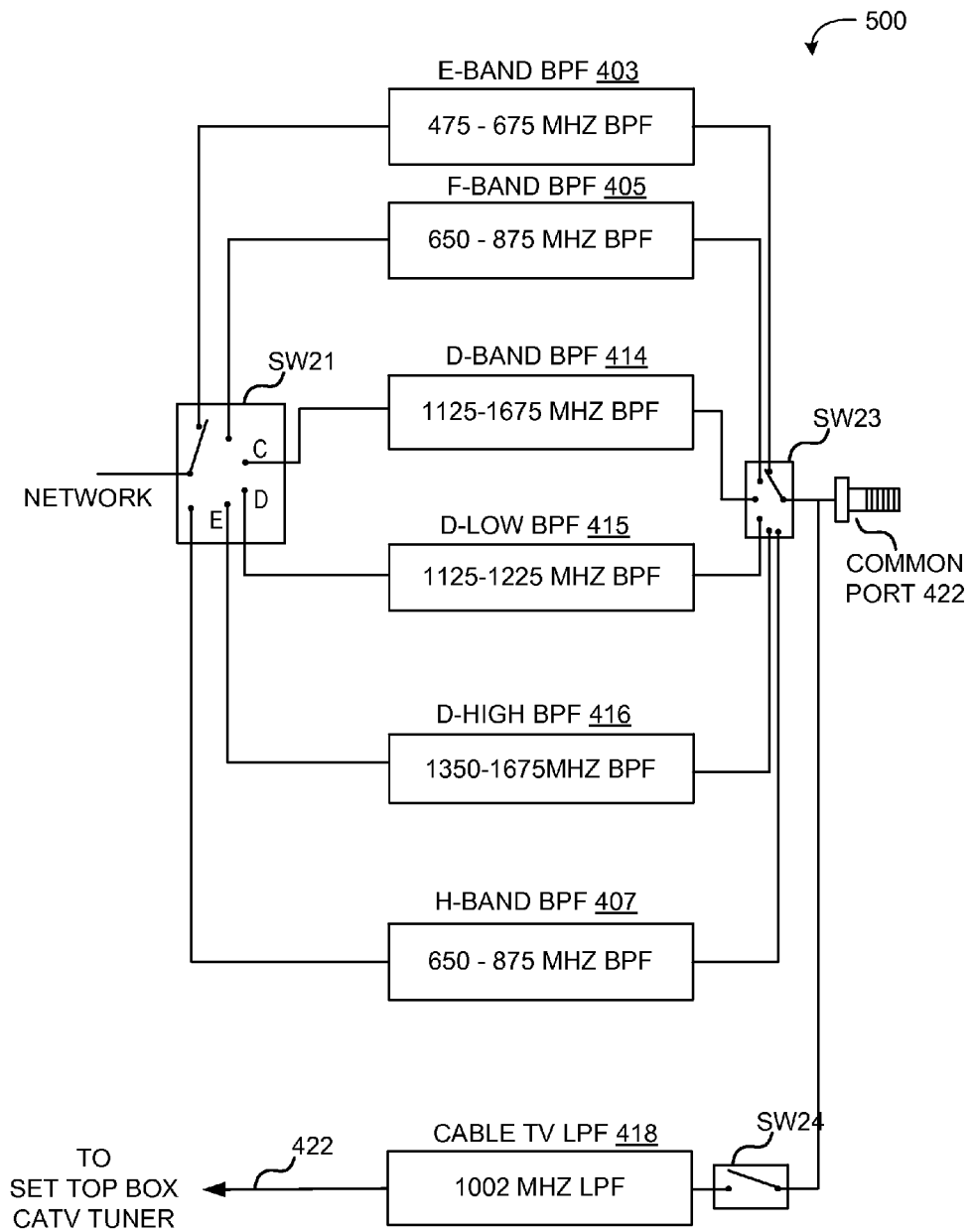
FIG. 6 is a diagram illustrating another example of a combination switchable diplexer in accordance with one embodiment of the systems and methods described herein.

In yet another embodiment, the D-band diplexers of the example in FIG. 5 are replaced by D-band bandpass filters and the cable TV signals are routed separately. FIG. 6 is a diagram illustrating an example of a switchable diplexer with a separate communication path for cable TV signals. Referring now to FIG. 6, in this example, the switchable diplexer 500 includes six bandpass filters for communication of 6 network bands, which in this example are MoCA bands. These bandpass filters are E-band bandpass filter 403, F-band bandpass filter 405, H-band bandpass filter 407, D-band bandpass filter 414; D-low band bandpass filter 415 and D-high band bandpass filter 416. Switch SW25, low pass filter 418 and signal path 422 are provided to allow selection of cable TV signals. In this embodiment as compared to that of FIG. 5, D-band diplexers are not used, and instead, D-band bandpass filters are provided to allow selection of D-band network communications and cable TV low pass filter is used to allow communication of cable TV signals to a set top box or other cable TV tuner. As a result, switch SW23 is not needed and a SPST switch SW24 can be used in its place. Switch SW24 can be mechanically or electronically coupled to switches SW21, SW23 to allow common control of the switching.

Figure 7:
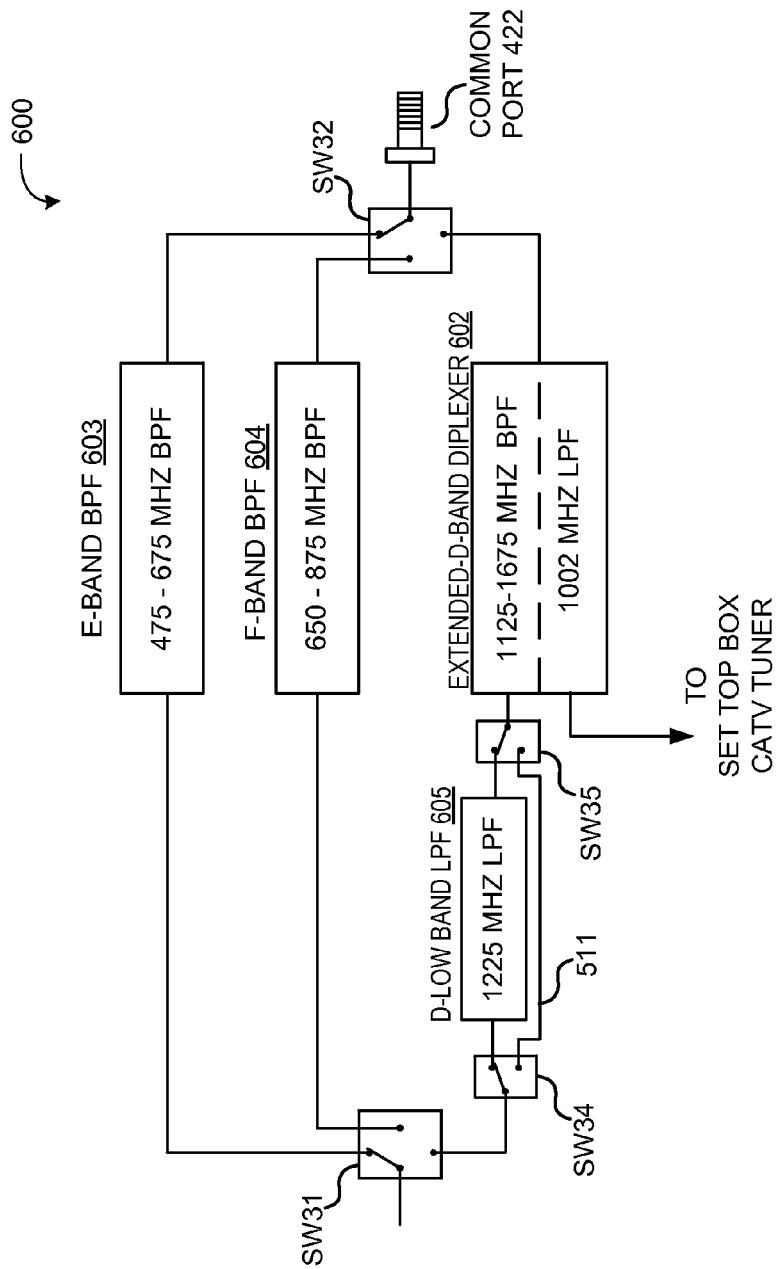
FIG. 7 is a diagram illustrating an example of a cascaded switchable diplexer in accordance with one embodiment of the systems and methods described herein.

FIG. 7 is a diagram illustrating an example of a cascaded switchable diplexer in accordance with one embodiment of the systems and methods described herein. Referring now to FIG. 7, switchable diplexer 600 includes bandpass filters and a diplexer for communication of 4 network bands, which in this example are MoCA bands. The bandpass filters are E-band bandpass filter 603 and F-band bandpass filter 604 for communicating network communications in the E and F bands. The diplexer in the illustrated example is an extended D-band diplexer 602 that is configured to pass signals in the 1125 MHz-1675 MHz range (D-band) through one leg and cable TV signals below 1002 MHz through the other leg.

Switches SW31 and SW32 are used to select which of the bands are passed by switchable diplexer 600. For example, in the illustrated embodiment switches SW31 and SW32 can select from among E band, F band and D band.

A D-low band low pass filter 605 is included in this example and connected in series with D-band diplexer 602, creating a cascaded, switchable diplexer enabling selection of a sub-band from within the passband of D-band diplexer 602.

Switches SW34 and SW35 are provided to switch a D-low band low pass filter 605 in or out of the circuit. When switches SW31 and SW32 are configured to route communications through D-band diplexer 602, switches SW34 and SW35 can be configured to either pass the signals through D-low band low pass filter 605 or through shunt 511. When switches SW34 and SW35 are configured to route signals through D-low band filter 605, the cascaded combination of D-low band low pass filter 605 and extended D-band diplexer 602 operate to create a D-low band bandpass filter with a passband of 1125 MHz-1225 MHz. When switches SW34 and SFW 35 are configured to pass the signal through shunt 511, switchable diplexer 600 passes signals in both the D-low and D-high bands.

For example, when switches SW34 and SW35 are configured to switch D-low band low pass filter 605 into the circuit, D-low band low pass filter 605 effectively stops signals above 1225 MHz. As a result, the passband of this cascaded combination is 1125 MHz to 1225 MHz.

Accordingly, the cascaded diplexer includes a diplexer (602 in this example) having a plurality of bandpass filters each having a passband; and a second bandpass filter (605 in this example) coupled in series with a bandpass filter in the diplexer. Preferably, the second bandpass filter has a passband that further limits the passband of the diplexer. That is the passband of the series bandpass filter is either a subset of, or overlaps with, the passband of the bandpass filter in the diplexer. In such embodiments, when the series bandpass filter is switched into the circuit, it further limits the passband of the circuit.

Figure 8:
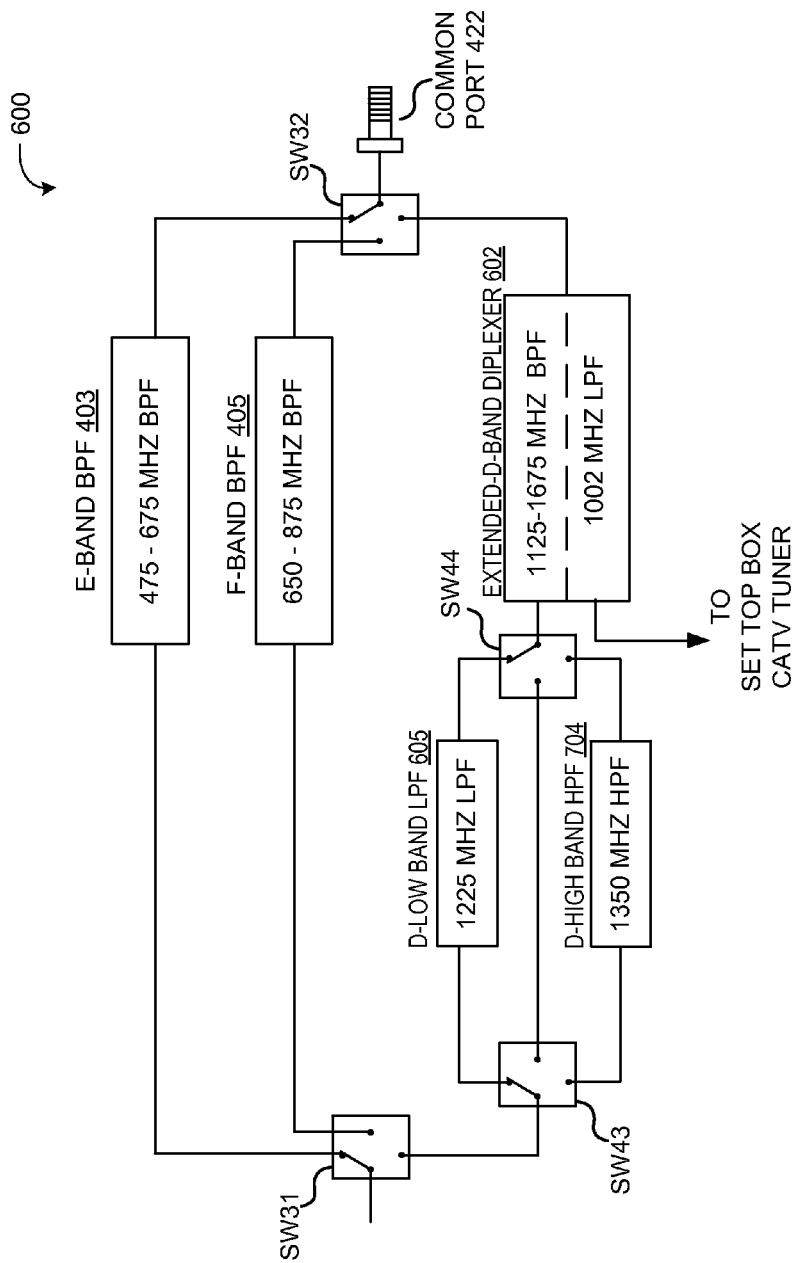
FIG. 8 is a diagram illustrating another example of a cascaded switchable diplexer in accordance with one embodiment of the systems and methods described herein.

FIG. 8 is a diagram illustrating another example of a cascaded switchable diplexer in accordance with one embodiment of the systems and methods described herein. In this example, D-high band high pass filter 704 with a cutoff frequency of 1350 MHz is added in parallel to D-low band low pass filter 605. When selected in conjunction with D-band diplexer 602, this D-high band high pass filter 704 would operate with extended D-band diplexer 602 as a D-high band diplexer.

Although not illustrated in the examples of FIG. 7 or 8, an H-band bandpass filter could also be included with the switchable diplexer to allow communication of H-band signals. In such embodiments, switches SW31 and SW32 can be modified to single-pole-four-throw switches to accommodate the added leg for the H-band bandpass filter. Likewise, other bandpass filters could be added to these or other embodiments described herein.

Although the example embodiments of FIGS. 7 and 8 are shown as having one cascaded diplexer circuit leg, it will become apparent to one of ordinary skill in the art after reading this disclosure that additional cascaded diplexer circuit legs can be included in the design. Likewise, the quantity of parallel bandpass filters (e.g., 403, 405) can be decreased or increased as needed to accommodate the desired frequency bands. In embodiments where parallel bandpass filters are eliminated, switches SW31, SW32 may also be eliminated.

The example switchable diplexers disclosed herein utilize bandpass filters with passbands suitable for communication in MoCA bands. It will become apparent to one of ordinary skill in the art after reading this description that the systems and methods described herein can be implemented using bandpass filters and diplexers configured to accommodate different passbands for communications in different frequency bands or for communications with different networking standards. It will also be appreciated by one of ordinary skill in the art that the examples described herein can be modified with fewer or a greater number of bandpass filters or diplexers to accommodate more or less different frequency bands.

The embodiments described herein with respect to FIGS. 5-8 can be laid out and physically configured in accordance with the embodiments described with reference to FIGS. 3 and 4. That is, the filters in the combination diplexers and cascaded diplexers can be arranged such that filters with like passbands or stop bands can be arranged adjacent to one another, and filters can be kept physically separate where one filter's stop band overlaps with (partially or completely) another filter's passband. Additionally, where one filter's stop band overlaps with (partially or completely) another filter's passband, those filters can be placed on separate secondary switches (e.g., as is the case with F-band bandpass filter 304 and D-low band bandpass filter 306 in FIG. 3) to better isolate those filters.

Although the systems and methods set forth herein are described in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A cascaded diplexer circuit, comprising:
a diplexer comprising a plurality of first bandpass filters;
a second bandpass filter; and
first and second switches configured to selectably switch either the second bandpass filter or a shunt in series between a communication signal and said one of the first bandpass filters, wherein when the shunt is selected, the second bandpass filter is completely disconnected from said one of the first bandpass filters.

2. The cascaded diplexer circuit of claim 1, wherein the passband of the second bandpass filter limits the passband of said one of the first bandpass filters.

3. The cascaded diplexer circuit of claim 1, wherein the passband of the second bandpass filter overlaps the passband of said one of the first bandpass filters.

4. The cascaded diplexer circuit of claim 1, further comprising
a plurality of additional bandpass filters; and
third and fourth switches to selectively connect one of the plurality of additional bandpass filters or the first and second switches between the communication signal and an output port.

5. The cascaded diplexer circuit of claim 1, further comprising a third bandpass filter coupled between the first and second switches, wherein the first and second switches are further configured to switch the third bandpass filter in series between the communication signal and said one of the first bandpass filters, and wherein when the third bandpass filter is selected, the second band pass filter and the shunt are completely disconnected from said one of the first bandpass filters.

6. The cascaded diplexer circuit of claim 4, wherein the additional bandpass filters comprise at least one of an E-band bandpass filter, an F-band bandpass filter, and an H-band bandpass filter.

7. A cascaded diplexer circuit, comprising:
a diplexer having a common terminal and first and second band-specific terminals, the diplexer comprising a plurality of first bandpass filters one of which being coupled between the common terminal and the first band-specific terminal and another of which being coupled between the common terminal and the second band-specific terminal;
a second bandpass filter having first and second terminals; and
a first switch having a common terminal coupled to the first band-specific terminal, a first selection terminal coupled to the first terminal of the second bandpass filter, and a second selection terminal coupled to a shunt to directly receive a communication signal, wherein the first switch is configured to selectably connect either the second bandpass filter or the shunt to the first band-specific terminal, and wherein when the shunt is selected, the second band pass filter is completely disconnected from the first band-specific terminal.

8. The cascaded diplexer circuit of claim 7, wherein a passband of the second bandpass filter limits a passband of said one of the first bandpass filters.

9. The cascaded diplexer circuit of claim 7, wherein a passband of the second bandpass filter is a subset of a passband of said one of the first bandpass filters.

10. The cascaded diplexer circuit of claim 7, further comprising:
  a plurality of additional bandpass filters; and
  second, third, and fourth switches, the second switch selectively connecting a communication signal either to the second terminal of the second bandpass filter or to the shunt, said third and fourth switches selectively connecting one of the plurality of additional bandpass filters, or the first switch and the common terminal of the diplexer, between a communication signal and a common port.

11. The cascaded diplexer circuit of claim 10, further comprising a third bandpass filter coupled between the first and second switches, wherein the first and second switches are further configured to switch the third bandpass filter in series between the communication signal and said first band-specific terminal, and wherein when the third bandpass filter is selected, the second band pass filter and the shunt are completely disconnected from the first-band specific terminal.

12. The cascaded diplexer circuit of claim 10, wherein the additional bandpass filters comprise at least one of an E-band bandpass filter, an F-band bandpass filter, and an H-band bandpass filter.

* * * * *